(12) United States Patent
Abendroth et al.

(10) Patent No.: US 8,728,576 B2
(45) Date of Patent: May 20, 2014

(54) METHOD FOR PRODUCING PHOTOCATALYTICALLY ACTIVE TITANIUM DIOXIDE LAYERS

(75) Inventors: Thomas Abendroth, Dresden (DE); Holger Althues, Dresden (DE); Stefan Kaskel, Dresden (DE); Ines Dani, Lichtenau (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 107 days.

(21) Appl. No.: 13/121,785

(22) PCT Filed: Oct. 9, 2009

(86) PCT No.: PCT/DE2009/001474
§ 371 (c)(1),
(2), (4) Date: Jun. 14, 2011

(87) PCT Pub. No.: WO2010/043215
PCT Pub. Date: Apr. 22, 2010

(65) Prior Publication Data
US 2011/0244130 A1 Oct. 6, 2011

(30) Foreign Application Priority Data
Oct. 14, 2008 (DE) .......... 10 2008 052 098

(51) Int. Cl.
*C23C 16/02* (2006.01)
*C23C 16/40* (2006.01)

(52) U.S. Cl.
USPC ............. 427/255.36; 427/255.29; 427/255.23

(58) Field of Classification Search
None
See application file for complete search history.

(56) References Cited

U.S. PATENT DOCUMENTS

| 777,374 A | 12/1904 | Howard |
| 3,785,851 A | 1/1974 | Novice |
| 5,298,587 A * | 3/1994 | Hu et al. .......... 528/10 |
| 6,113,983 A | 9/2000 | Zachariah et al. |

(Continued)

FOREIGN PATENT DOCUMENTS

| DE | 10 2004 045 321 | 3/2006 |
| EP | 1 650 325 | 4/2006 |

OTHER PUBLICATIONS

Biedermann, DE10-2004 045321, Mar. 2006, English Machine translation (from EP cite).*
Aarik et al., "Morphology and structure of TiO2 thin films grown by atomic layer deposition", Journal of Crystal Growth, vol. 148, No. 3, Mar. 1, 1995, pp. 268-275.

(Continued)

*Primary Examiner* — Joseph Miller, Jr.
(74) *Attorney, Agent, or Firm* — Fay Kaplun & Marcin, LLP

(57) ABSTRACT

A method for manufacturing photocatalytically active titanium dioxide layers on substrate surfaces. The method reduces the effort for the manufacture of photocatalytically active titanium dioxide layers and increases the choice for the coating of suitable substrate materials. In the method, a titanium compound present in the gas phase and water vapor are directed to a preheated substrate by means of gas phase hydrolysis and a titanium dioxide layer is foamed on the surface of the substrate by chemical reaction. In this respect, the titanium compound and water vapor are supplied separately from one another so that a flow speed of at least 0.5 m/s is achieved and the time between the first contact of the two gases up to the impact on the surface of the substrate is kept lower than 0.05 s, and in this process the photocatalytically active titanium dioxide layer is formed on the substrate surface.

11 Claims, 6 Drawing Sheets

(56) References Cited

U.S. PATENT DOCUMENTS

| | | |
|---|---|---|
| 6,268,019 B1 * | 7/2001 | Florczak ........................ 427/166 |
| 6,921,707 B1 | 7/2005 | Zinn et al. |
| 2001/0009140 A1 * | 7/2001 | Bondestam et al. .......... 118/725 |
| 2005/0214533 A1 * | 9/2005 | Shimosaki et al. ........... 428/375 |

OTHER PUBLICATIONS

Kamata et al., "Rapid Formation of TIO2 Films by a Conventional CVD Method," Journal of Materials Science Letters, Chapman and Hall Ltd:, Ondon, GB, vol. 9, No. 3, Mar. 1, 1990, pp. 316-319, XP000159766, ISSN: 0261-8028, DOI: 10.1007/BF00725836.

* cited by examiner

METHOD FOR PRODUCING PHOTOCATALYTICALLY ACTIVE TITANIUM DIOXIDE LAYERS

FIELD OF INVENTION

The invention relates to a method of manufacturing photocatalytically active titanium dioxide layers on substrate surfaces. In this process, the most varied substrate materials can be coated which may also be temperature-sensitive.

BACKGROUND INFORMATION

The use of elements coated in this manner is possible in a variety of manners and advantageous effects can be utilized. A self-cleaning effect can thus be utilized for windows or frontage elements. An independent sterilization can be utilized for the cleaning of the air with wall coverings or in vehicle passenger compartments. Organic compounds can be oxidized by reaction with oxygen to form carbon dioxide and water when the coated surface is exposed to suitable electromagnetic radiation. Photocatalytically active titanium dioxide has a high proportion of titanium dioxide for this purpose in the anatas modification. As a consequence of a bandgap at 3.2 eV, electromagnetic radiation having wavelengths below 388 nm can be utilized for exciting electron-hole pairs for initiating the reactions.

Surfaces thus coated can also be hydrophilic so that a formation of water droplets on the surface can be avoided and fogging protection can be achieved due to the formation of a water film.

In addition, microbiological growth can be prevented, but at least impeded.

Different processes are known and are also used for the formation of the titanium dioxide layers in question. In many cases, the manufacture is, however, associated with high effort and costs. Such coatings are thus formed using the most varied PVD processes. In this respect, the effort is, however, substantial due to the required vacuum technology.

Sol-gel processes and thermal oxidation processes require very high temperatures and can therefore not be used for the coating of all materials. The time effort for this is likewise high. The layers can also be sprayed on thermally, which, however, causes a low layer quality and rough surfaces.

CVD processes under vacuum conditions with and without plasma assistance or photon assistance have similar disadvantages to PVD processes.

An approach using a CVD process under normal atmospheric pressure is known from EP 1 650 325 A1. In this respect, in particular a formation of powder should be avoided which can normally not be avoided in such processes and impairs the plant engineering and the layer quality. It is proposed therein to form a metal oxide layer on a surface with the aid of gas phase hydrolysis. For titanium dioxide layers in this respect, in particular gaseous $TiCl_4$ and water vapor should be used as gases which chemically react with one another on contact. To avoid the formation of powder, it is proposed therein to utilize a shortened contact time of the two gases reacting with one another which should be 1 s at a maximum. A layer with titanium can thereby be obtained on the surface which can subsequently be calcinated at temperatures above 300° C. and only thereby can the ultimately photocatalytically active titanium dioxide layer be obtained.

It is obvious that the additional process step—calcination—increases the manufacturing effort and also that not all materials can be coated in this manner due to the temperatures required for it.

SUMMARY OF INVENTION

The present invention relates to reducing the effort for the manufacture of photocatalytically active titanium dioxide layers and to increasing the choice for the coating of suitable substrate materials.

Starting from the technical teaching known from EP 1 650 325 A1, it has, however, surprisingly been found that photocatalytically active titanium dioxide layers can be obtained solely with gas phase hydrolysis as a CVD process if the gases used for this purpose, namely a titanium compound present in the gas phase and water vapor, are supplied so that they are first separate from one another and are only brought together briefly before the surface on which the layer should be formed and the contact time up to the impact on the surface is reduced by orders of magnitude. The two gaseous components are in this respect supplied so that they have a flow speed of at least 0.5 m/s, preferably at least 2 m/s, and the time between the contact of the two gases up to the impact on the substrate surface to be coated is kept lower than 0.05 s, preferably lower than 0.001 s.

This can be achieved, in addition to the high flow speed, in that the spacing between outlet openings of nozzles of an apparatus for supplying the gases, through which at least one of the two gases reacting with one another (titanium compound or water vapor) is supplied, is kept small up to the surface to be coated. As a rule, this will be a few millimeters. In this respect, outlet openings of nozzles for the gaseous titanium compound or outlet openings for water vapor can have this small spacing. There is, however, also the possibility of keeping the spacing of outlet openings for these two gases so small. In this respect, the spacing of the outlet openings from the substrate surface can be arranged equally far away, only slightly far away from one another or also very far away from one another. Only the possible reaction time should thus be shortened. The maximum spacing of an outlet opening which influences the available reaction time should not exceed 20 mm, preferably not 10 mm.

It is possible using the method in accordance with the invention to manufacture the desired photocatalytically active titanium dioxide layers in one go. No further posttreatment is necessary and the layers are directly subsequently usable. Only a preheating of the substrates to be coated is necessary such as was also the case with the already known process to avoid condensation of the two gases reacting with one another before the impact on the substrate surface. The temperatures required for this purpose are, however, considerably lower than is the case for calcination. Polymers or also paper can thus, for example, also be coated in addition to other materials in accordance with the invention. Films can also be coated in this manner.

In addition to the suitable titanium compounds known per se such as also $TiCl_4$, it has been found particularly preferable to use tetraisopropyl orthotitanate, also called TTIP in the following, as a suitable titanium compound. Titanium alkoxides or titanium alcoholates such as —$Ti(C_2H_5O)_4$—, titanium-n-butoxide —$Ti(n-C_4H_9O)_4$— or titanium t-butoxide —$Ti(t-C_4H_9O)_4$ can also be used.

The two gaseous components can be supplied with an additional propellant gas. The two gases can be diluted in this manner. In this respect, water vapor can be supplied with the propellant gas as a mixture, the titanium compound with the propellant gas as a mixture, or the two gas components reacting with one another as such a mixture. A propellant gas should preferably be an inert gas such as nitrogen or argon. Further gaseous components can be admixed by which a doping of the titanium oxide layer can be achieved. A chemical compound suitable for this purpose is e.g. niobium(V) ethoxide. An increased electrical conductivity of a titanium dioxide layer can be achieved by a niobium doping.

The respective volume flows of the two gas components reacting with one another should be set for the formation of the layer so that water is present in excess. A mol ratio of 2 to 1 for water and titanium compound should at least be observed. A mol ratio of 10 to 1 is preferred, with all the water not reacting in this case.

If TTIP is used as the titanium compound, the following total reaction can run over a plurality of intermediate stages:

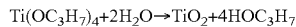

$$Ti(OC_3H_7)_4+2H_2O \rightarrow TiO_2+4HOC_3H_7$$

The first part reaction is the hydrolysis of the TTIP:

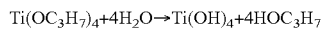

$$Ti(OC_3H_7)_4+4H_2O \rightarrow Ti(OH)_4+4HOC_3H_7$$

It can be assumed in this respect that this part reaction has to run completely for the formation of a high-quality titanium dioxide layer, which can be promoted by an excess of water. In this respect, isopropanol can be split off as a non-critical byproduct.

A condensation reaction while forming the titanium dioxide is to be considered a further part reaction.

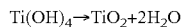

$$Ti(OH)_4 \rightarrow TiO_2+2H_2O$$

This part reaction is promoted by increased temperatures for splitting off the water.

To split off the water and to avoid the condensation of water, the substrates to be coated should be preheated so that they have a temperature in the range 100° C. to 250° C. This temperature should be reached at least at the surface to be coated.

An apparatus for supplying the gases and a substrate to be coated can be moved relative to one another to coat larger surfaces or to form a defined structure of a titanium dioxide layer on a surface. In this respect, influence can also be taken on the layer thickness of the layer with the selection of the feed speed. A plurality of individual titanium oxide layers can also be formed above one another on the substrate surface.

An apparatus for supplying the gases should also be heated. In this respect, the temperature should be kept so high that neither water vapor nor the gaseous titanium compound can condense within the apparatus.

It is advantageous in the method in accordance with the invention that energy is only required to keep the two components required for the gas phase hydrolysis gaseous and to preheat the substrate. No reduction of the working pressure is required and work can take place in the range of normal atmospheric pressure (1 bar).

Large surfaces can be coated. It is not necessary that a surface to be coated is formed as planar or as very largely planar. There is thus the possibility of also coating three-dimensionally shaped surfaces, hollow spaces or also pipes on the inside using an apparatus for the supply of the gases suitable for this purpose.

A mechanical and also a thermal posttreatment can be dispensed with. A use of a substrate coated using the method is possible directly after the formation of the titanium dioxide layer. A formation of powder did not occur in the carrying out of the method in accordance with the invention.

The photocatalytically active titanium dioxide layers obtained with the invention achieve very good photocatalytic efficiency in comparison with titanium dioxide layers manufactured in a different manner. A stearin degradation rate of above 40 nm/h can thus be achieved on irradiation with electromagnetic radiation of a wavelength of 366 nm. The layers manufactured in accordance with the invention are very hydrophilic on a reduction of the water contact angle from 70° to 10° within a time period of 6 min on irradiation at a wavelength of 254 nm. The optical refractive index is between 2 and 2.6 with a small reached extinction coefficient. The layers obtained are very smooth at the surface. With a titanium dioxide layer produced in accordance with the invention on a silicon wafer as a substrate, a roughness of $R_a=3.9$ nm could thus be determined. The layers had good adhesion and were able to be formed with layer thicknesses between 10 and 1000 nm.

BRIEF DESCRIPTION OF DRAWINGS

The invention will be explained in more detail by way of example in the following.

There are shown.

DETAILED DESCRIPTION

Figure 1:
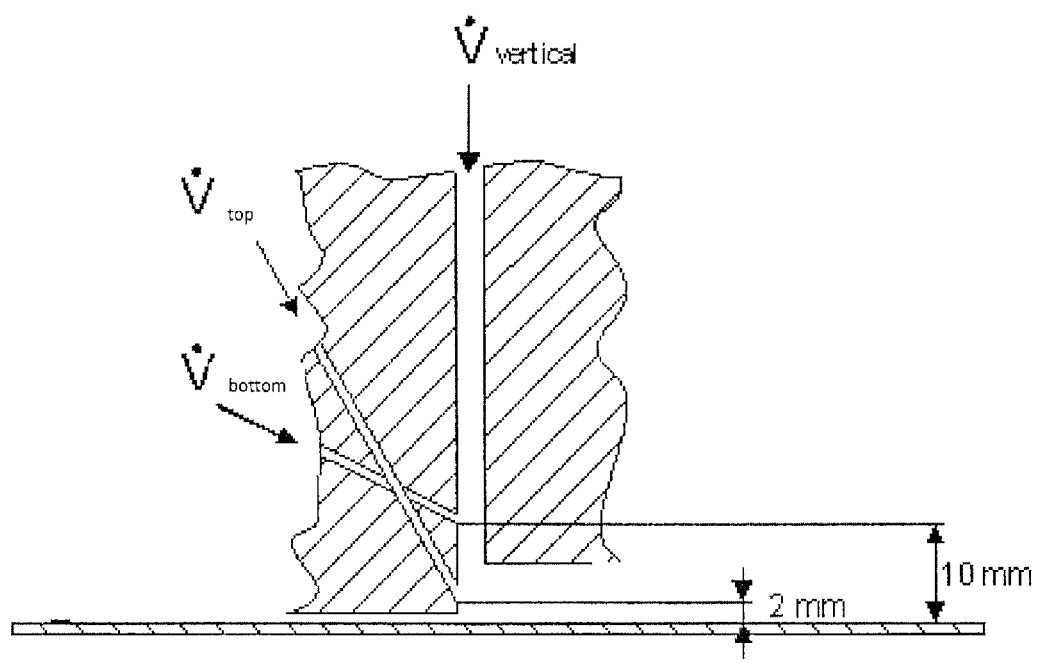
FIG. 1 in a partly sectional representation, an example of an apparatus for supplying gases which can be used in carrying out the method in accordance with the invention.
Figure 2:
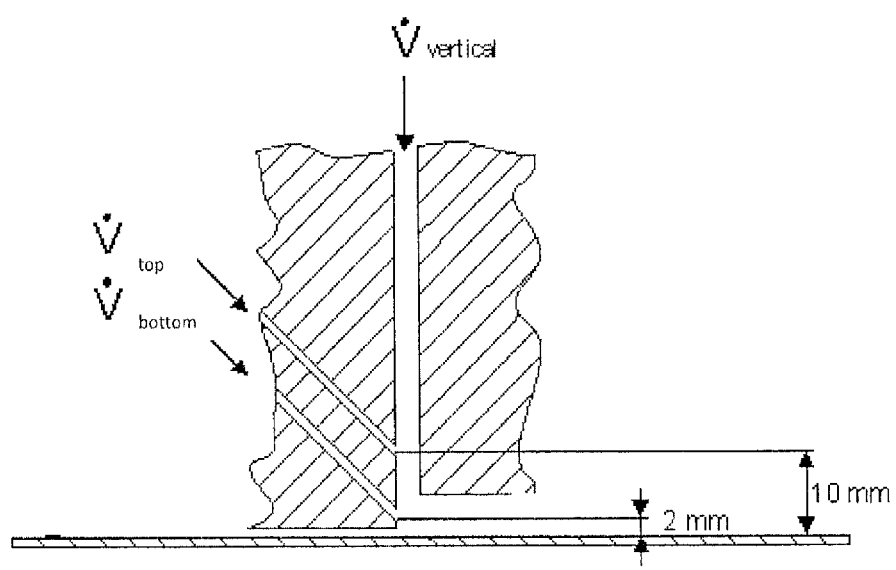
FIG. 2 in a partly sectional representation, a further example of an apparatus for supplying gases which can be used in carrying out the method in accordance with the invention.

Examples for apparatus for a supply of gases are shown in FIGS. 1 to 3 which can be used in the method in accordance with the invention.

Possibilities for a passage guide are illustrated with the representation in accordance with FIG. 1 via which the required gases can be supplied in the direction of the substrate surface. A passage is aligned vertically here and its middle longitudinal axis extends perpendicular to the substrate surface. The volume flow $V_{vertical}$ is supplied through it. This can be solely nitrogen as a carrier gas. The outlet opening can be formed as a slit nozzle. There is, however, also the possibility of providing a plurality of such individual passages in a row arrangement. The gas components actually reacting with one another can be supplied via the further passages differently obliquely inclined.

In this respect, the spacings of the lower edges of exit openings from the substrate surface of these inclined passages are dimensioned in FIG. 1. The passages via which the volume flow $V_{bottom}$ is conducted are inclined at an angle of 64° with respect to the substrate surface. A gas mixture of nitrogen as the carrier gas with water vapor or TTIP was supplied at 5 to 20 slm through these passages having a number of 49 and a diameter of the outlet openings of 1 mm. The passages were arranged in a row and had a spacing of 3 mm in each case.

These parameters also apply to the other passages shown via which the volume flow $V_{top}$ can be supplied. Only the angle of inclination was selected smaller at 30°. In this respect, a total of 50 channels were arranged in a row.

In the apparatus shown in FIG. 2, two rows of passages have again been selected which are arranged above one another. They are, however, inclined at the same angle of 45° and a respective 75 passages were used at spacings of 2 mm respectively from one another. Only the spacings of the outlet openings from the substrate surface were different in both passage rows.

Figure 3A:
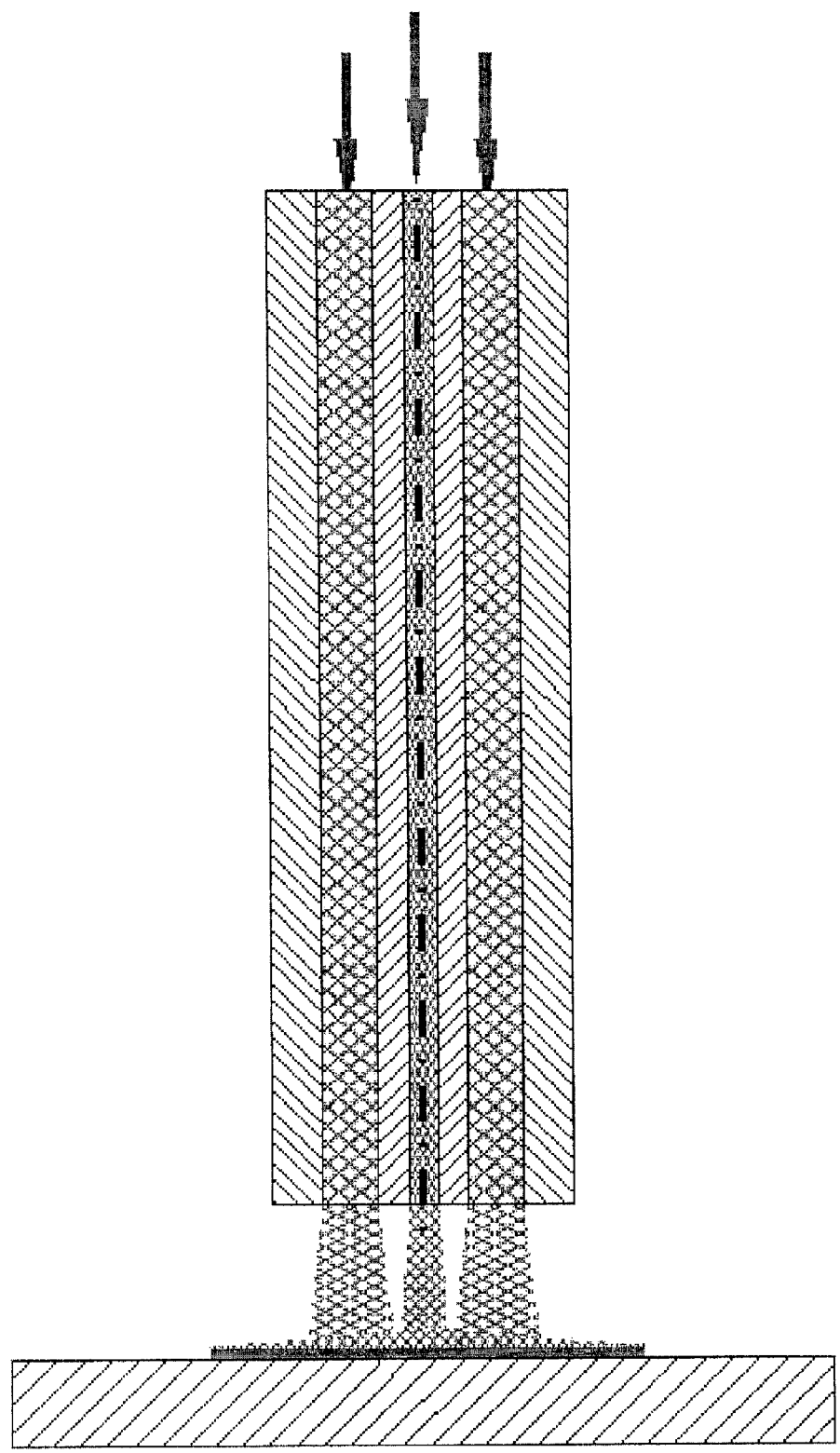
FIGS. 3a and b in a partly sectional representation, two further examples of an apparatus for supplying gases which can be used in carrying out the method in accordance with the invention.
Figure 3B:
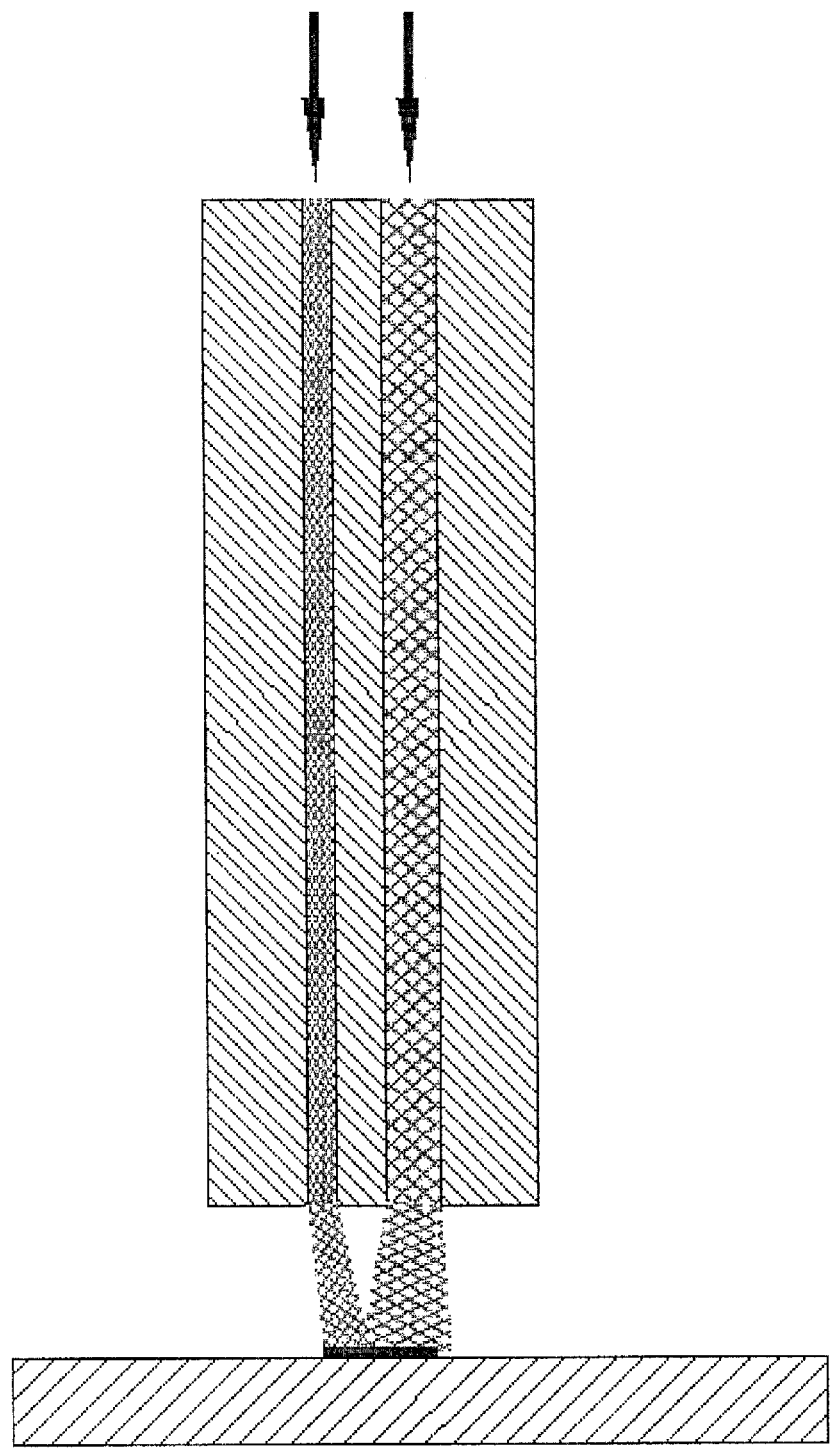

In the possibilities for apparatus for a gas supply shown in FIGS. 3a and 3b, a plurality of parallel passages are present whose longitudinal axes are all aligned perpendicular to the substrate surface. In FIG. 3a, there are three passages or a ring passage in whose interior a further middle passage can be arranged. In the representation of FIG. 3b, two parallel passages are present which, however, have different free inner cross-sections.

In the apparatus in accordance with FIG. 1, a mixture which is formed with carrier gas and water vapor can be supplied through the two outer passages or the ring passage and TTIP alone through the central passage.

In the representation of FIG. 3b, this likewise applies accordingly since carrier gas and water vapor can likewise be supplied there through the right passage having the larger free inner cross-section and TTIP in gas phase alone through the left passage. In both variants shown, the outlet openings of the passages are disposed in a plane so that there is an equal spacing from the substrate surface. The spacing can be varied in this respect. This also applies to an inclination. An alignment of the gas flow at a changing surface topography of a three-dimensionally formed substrate surface or a three-dimensional coating can thus be achieved.

In experiments, work was carried out at flow speeds of the gases in the range 2 to 11 m/s. The parameters of Table 1 were taken into account for an apparatus in accordance with FIG. 1.

TABLE 1

| Number of passages | Gas flow [slm] | Throughflow/passage | Flow speed [m/s] | Reynolds number |
|---|---|---|---|---|
| 49 | 5 | 0.10204 | 2.1653 | 163.13 |
|  | 25 | 0.5102 | 10.8268 | 815.67 |
| 50 | 5 | 0.1 | 2.12207 | 159.87 |
|  | 25 | 0.5 | 10.6103 | 799.35 |

It can be demonstrated by the resulting Reynolds number of the gas flows that laminar flow relationships were present since the Reynolds number critical for this was not reached by a large amount.

The TTIP was heated up to above its boiling temperature (232° C.) and supplied in gaseous form. A supply can, however, also take place via a bubbler with the aid of a carrier gas at which lower temperatures of up to approx. 80° C. are present.

Figure 4:
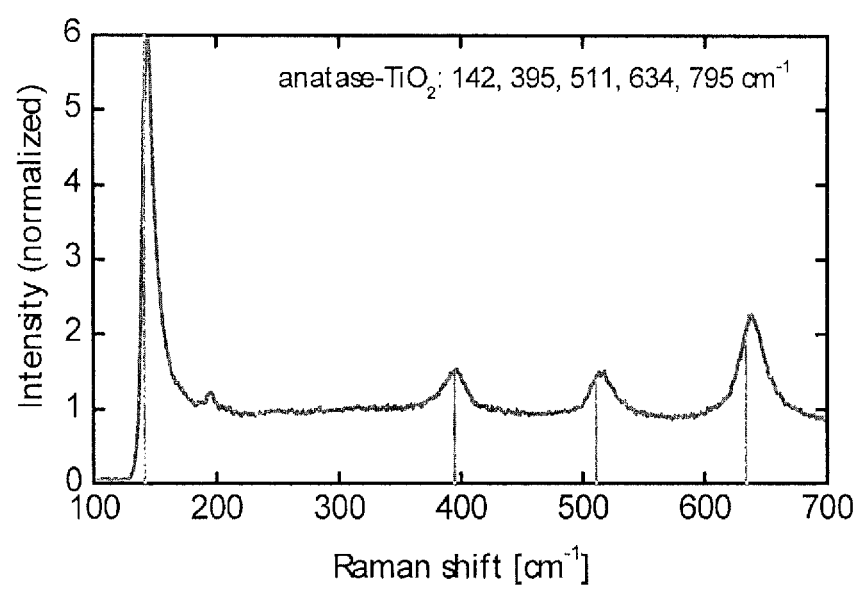
FIG. 4 a Raman spectrum of a photocatalytically lactive titanium dioxide layer manufactured using the method in accordance with the invention.
Figure 5:
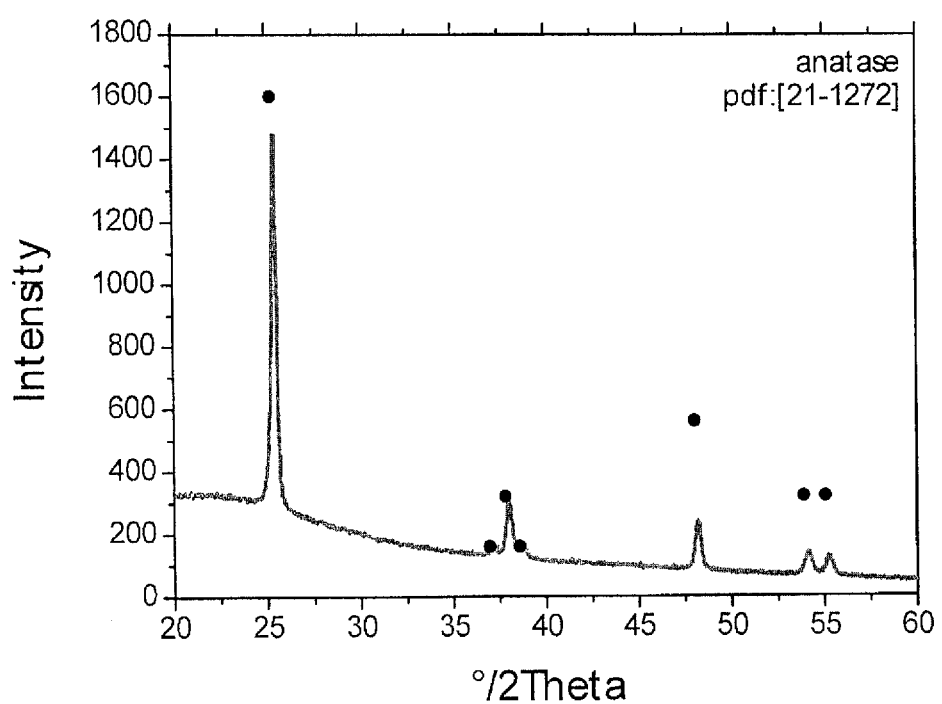
FIG. 5 an X-ray diffractograph of a photocatalytically active titanium oxide layer manufactured using the method in accordance with the invention.

The diagrams shown in FIGS. 4 and 5 also demonstrate the high proportion of anatas in the formed titanium dioxide layer which is important for the photocatalytic activity.

Example 1

Titanium dioxide layers were formed using an apparatus such as is shown in FIG. 1. An apparatus having a gas distribution system was arranged above a substrate to be coated and the substrate was moved on the coating. TTIP was directed onto the substrate surface at a mass flow of 15 g/h and a carrier gas flow of 20 l/min as $V_{bottom}$ through the lower passages whose outlet openings are arranged closest to the substrate surface and have a diameter of 1 mm. A flow speed of this gas mixture of 8.66 m/s resulted. Water was directed in the direction of the surface to be coated at 19.4 g/h with a carrier gas flow of 33 l/min as $V_{top}$. Since 50 passages were used here whose outlet openings likewise had a diameter of 1 mm, a flow speed of this gas mixture of 14 m/s resulted. Nitrogen likewise flowed onto the surface through the third passage at 15 l/min as $V_{vertical}$.

The passages were heated to a temperature of 100° C.

Substrates of glass or stainless steel having a thickness of 1 mm were heated to a temperature of 250° C. The coating took place with 10 cycles, with one cycle being divided into a forward movement and a rearward movement. On the forward movement, the substrate was moved at a speed of 5 mm/s and on the rearward movement at 30 mm/s. The titanium dioxide layers deposited on a substrate of stainless steel had an optical refractive index of 2.43 at a wavelength of 550 nm and a layer thickness of 244 nm. The crystallinity (anatas modification) of the titanium dioxide was able to be demonstrated by means of Raman spectroscopy. The photocatalytic activity was determined linearly by the degradation rate of stearic acid layers having a value of 42.9 nm/h on irradiation with electromagnetic radiation of a wavelength of 366 nm which was emitted by a UV lamp (I=1 mW/cm$^2$).

Example 2

Titanium dioxide layers were formed using an apparatus such as is shown in FIG. 2. The apparatus was attached above a substrate surface to be coated and was able to be moved two-dimensionally in an X-Y direction.

TTIP having a mass flow of 7.6 g/h in a carrier gas flow of 2 l/min was in this respect supplied through the lower passages arranged with their outlet opening closer to the substrate as $V_{bottom}$. A flow speed of 0.56 m/s resulted for this gas mixture with the 75 passages used for this purpose whose outlet openings had a diameter of 1 mm. 13 g/h water and 4 l/min carrier gas were supplied through the upper 75 passages whose outlet openings likewise had a diameter of 1 mm as $V_{top}$. A flow speed of this gas mixture of 1.12 m/s resulted in this process. A gas mixture of argon/nitrogen was supplied through the vertically aligned passage at 55 l/min as $V_{vertical}$. The passages were heated to a temperature of 100° C. and substrates to be coated of glass or stainless steel having a thickness of 1 mm were heated to a temperature of 250° C.

The apparatus was moved at a speed of 25 mm/s and at an increment of 1.5 mm in meander form over the substrate surface. The spacing of the apparatus from the surface of the substrate was kept constant during the formation of the coating in all examples.

Homogeneous layers were able to be obtained. The titanium dioxide layers thus formed on stainless steel had an optical refractive index of 2.41 at a wavelength of 550 nm and a layer thickness of 111 nm.

The high crystallinity (anatas modification) of the titanium dioxide was able to be demonstrated by means of Raman spectroscopy, as is shown in FIG. 4. The photocatalytic activity was determined linearly by the degradation rate of stearic acid layers having a value of 40.7 nm/h on irradiation with electromagnetic radiation of a wavelength of 366 nm which was emitted by a UV lamp (I=1 mW/cm$^2$).

Glass substrates coated in an analog manner had titanium dioxide layers with an optical refractive index of 2.54 at a wavelength of 550 nm and a layer thickness of 82 nm. The crystallinity of the titanium dioxide was demonstrated by means of X-ray diffractometry (XRD), as can be seen from FIG. 5.

Experiments were moreover carried out on titanium dioxide layers obtained in the above-explained form, with the formation of the layers taking place on substrates which had been heated to a temperature of only 100° C. In this respect, substrates of glass, stainless steel, aluminum, paper and polymers were coated. With layer thicknesses of 95 nm, an optical refractive index was reached of 1.99 at λ=550 nm. The titanium oxide layers likewise had photocatalytic activity, which was able to be demonstrated by color change in the resazurin dye test. They were superhydrophilic. With titanium dioxide layers on glass, a degradation rate of stearic acid of 2.3 nm/h was able to be determined.

The invention claimed is:

1. A method for manufacturing photocatalytically active titanium dioxide layers using gas phase hydrolysis, comprising:
    directing a titanium compound present in the gas phase through a first passage of a gas supply apparatus and a water vapor through a second passageway of the gas supply apparatus onto a preheated substrate to form a photocatalytically active titanium dioxide layer on a surface of a substrate by chemical reaction;
    wherein the titanium compound and the water vapor are supplied first separately from each other through the first and second passages, respectively, and are mixed upon exiting the first and second passages,
    wherein the supply of the titanium compound and the water vapor takes place in such a manner that a flow speed of at least 0.5 m/s is achieved,
    wherein a time period between a first contact of the two gases up to the impact on the surface of the substrate is kept lower than 0.05 s,
    wherein a maximum spacing between outlet openings for the titanium compound and the water vapor from the surface of the substrate is 20 mm, and
    wherein the formation of the titanium dioxide layer is carried out at atmospheric pressure in one deposition step.

2. The method in accordance with claim 1, wherein a tetraisopropyl orthotitanate (TTIP) is used as the titanium compound.

3. The method in accordance with claim 1, wherein an inert carrier gas is directed onto the substrate surface.

4. The method in accordance with claim 1, wherein an inert carrier gas is directed onto the substrate surface in a mixture with at least one of the two gases.

5. The method in accordance with claim 1, wherein the water vapor is supplied in excess.

6. The method in accordance with claim 1, wherein the substrate is heated to a temperature in the range 100° C. and 250° C.

7. The method in accordance with claim 1, wherein the gases are directed onto the substrate surface as a laminar flow.

8. The method in accordance with claim 1, wherein the gases are directed onto the substrate surface at a flow speed of at least 2 m/s and wherein the time period between the first contact of the two gases up to the impact on the surface of the substrate is kept lower than 0.001 s.

9. The method in accordance with claim 1, wherein a mol ratio of at least 2 to 1 for water and the titanium compound is observed.

10. The method in accordance with claim 1, wherein the gas supply apparatus and a substrate are moved relative to one another.

11. The method in accordance with claim 10, wherein the gas supply apparatus is heated to a temperature above a condensation temperature of the supplied gases.

* * * * *